US006529178B1

United States Patent
Kimura

(10) Patent No.: US 6,529,178 B1
(45) Date of Patent: Mar. 4, 2003

(54) CURRENT-DRIVEN EMISSIVE DISPLAY DEVICE, METHOD FOR DRIVING THE SAME, AND METHOD FOR MANUFACTURING THE SAME

(75) Inventor: Mutsumi Kimura, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/171,117

(22) PCT Filed: Feb. 16, 1998

(86) PCT No.: PCT/JP98/00646

§ 371 (c)(1),
(2), (4) Date: Oct. 13, 1998

(87) PCT Pub. No.: WO98/36405

PCT Pub. Date: Aug. 20, 1998

(30) Foreign Application Priority Data

Feb. 17, 1997 (JP) .............................................. 9-032480

(51) Int. Cl.[7] ................................................ G09G 3/30
(52) U.S. Cl. ...................................... 345/76; 315/169.3
(58) Field of Search ............................ 345/76–83, 36, 345/45, 204, 208, 209, 211, 214; 340/825.81; 315/169.3

(56) References Cited

U.S. PATENT DOCUMENTS

| | | | | |
|---|---|---|---|---|
| 3,736,585 A | * | 5/1973 | Langheinrich ................ | 345/36 |
| 4,887,074 A | | 12/1989 | Simon et al. .................. | 345/82 |
| 5,386,179 A | * | 1/1995 | Sato ........................ | 315/169.3 |
| 5,510,633 A | * | 4/1996 | Orlowski et al. ............. | 257/93 |
| 5,552,678 A | * | 9/1996 | Tang et al. ................ | 315/169.3 |
| 5,719,589 A | * | 2/1998 | Norman et al. ................ | 345/82 |
| 5,828,181 A | * | 10/1998 | Okuda ..................... | 345/169.3 |
| 5,982,345 A | * | 11/1999 | Takayama et al. ............. | 345/76 |

FOREIGN PATENT DOCUMENTS

| | | | |
|---|---|---|---|
| DE | 26 33 270 A | 1/1978 | |
| EP | 0 717 439 A | 6/1996 | |
| JP | U-56-120795 | 9/1981 | |
| JP | U-60-183459 | 12/1985 | |
| JP | 05 198843 A | 8/1993 | |
| JP | A-6-230745 | 8/1994 | |
| JP | 07 273371 A | 10/1995 | |
| JP | A-7-335941 | 12/1995 | ........... H01L/33/00 |
| JP | 407335941 | * 12/1995 | ........... H01L/33/00 |
| JP | 09 218664 A | 12/1997 | |

* cited by examiner

Primary Examiner—Richard Hjerpe
Assistant Examiner—Alexander Eisen
(74) Attorney, Agent, or Firm—Oliff & Berridge, PLC

(57) ABSTRACT

A reduction in deterioration of a switching element over time in a current driving type emissive apparatus is realized. At the same time, a reduction in power consumption is realized. To this end, an AC voltage or an alternating current is applied between a source and a drain terminal of a switching element, and a DC voltage or a direct current is applied between a first and a second terminal of a luminescent element. This is realized by application of a voltage, which is inverted at predetermined intervals, to two luminescent elements heterogeneously arranged, to a luminescent element and a rectifier arranged in reverse orientation and in parallel, or to a full-wave rectification circuit. At this time, the rectifier is formed by a thin-film transistor, a PN junction, or a PIN junction, and is formed simultaneously with an existing switching element.

15 Claims, 19 Drawing Sheets

CURRENT-DRIVEN EMISSIVE DISPLAY DEVICE, METHOD FOR DRIVING THE SAME, AND METHOD FOR MANUFACTURING THE SAME

BACKGROUND OF THE INVENTION

1. Field of the Invention

The present invention relates to a current driving type emissive display apparatus such as an organic electro luminescence (hereinafter referred to as an "organic EL") device having a thin-film transistor and a method for driving the apparatus, and more particularly, to a technique for realizing a reduction in deterioration over time or a reduction in both deterioration over time and electric power consumption simultaneously.

2. Description of Related Art

An operation of a conventional current driving type emissive apparatus such as an organic EL having thin-film transistors will be described with reference to FIGS. 16, 17, and 18.

FIG. 16 is an equivalent circuit diagram of one pixel of the conventional organic EL display device having thin-film transistors, FIG. 17 is an equivalent circuit diagram showing a matrix construction of the conventional organic EL display device having thin-film transistors, and FIG. 18 is a driving voltage diagram of the conventional organic EL display device having thin-film transistors.

Provided are: a data line 112; a first switching element 121 (hereinafter referred to as a "switching thin-film transistor") in which the source-terminal side is connected to the data line 112 and a gate electrode is connected to a scanning line 111; a holding electrode 113 for storage capacity, in which one terminal is connected to the drain terminal side of the switching thin-film transistor 121; a second switching element 122 (hereinafter referred to as a "current thin-film transistor"), in which a gate terminal is connected to the drain terminal of the switching thin-film transistor and the source terminal is connected to a first feeder 114; and an organic EL device 135, one terminal of which is connected to the drain terminal of the current thin-film transistor and the other terminal of which is connected to a second feeder.

The switching thin-film transistor 121 controls the conduction between the data line 112 and the holding electrode 113 by the potential of the scanning line 111. That is, a scanning potential 211 controls the conduction between a signal potential 212 and a holding potential 213. Although an n-channel type thin-film transistor is employed as the switching thin-film transistor 121 in this example, a p-channel type thin-film transistor may also be employed. In such an example the high-potential-side of the scanning potential 211 and the low-potential-side thereof are reverse to those of this embodiment.

In a pixel in a displaying condition, the signal potential 212 is high and the high potential is held at the holding potential 213. In a pixel in a non-displaying condition, the signal potential 212 is low and the low potential is held at the holding potential 213.

The current thin-film transistor 122 controls the conduction between the first feeder 114 and a pixel electrode 115 by the potential. of the holding electrode 113. That is, the holding potential 213 controls the conduction between a first feed potential 214 and a pixel potential 215. Although an n-channel type thin-film transistor is employed as the current thin-film transistor 122 in this example, a p-channel type thin-film transistor may also be employed. In such an example the high-potential-side of the signal potential 212 and the low potential thereof are reverse to those of this embodiment.

In a pixel in a displaying condition, the holding potential 213 is high, so the first feeder 114 and the pixel electrode 115 are electrically connected. In a pixel in a non-displaying condition, the holding potential 213 is low, so the conduction between the first feeder 114 and the pixel electrode 115 is interrupted.

In a pixel in a displaying condition, the current flows from the first feeder 114 through the current thin-film transistor 122 and the pixel electrode 115 to a second feeder 116, and the organic EL device 135 emits light. In a pixel in a non-displaying condition, no current flows, and the organic EL device will not emit light.

Since the first feed potential 214 is higher than a second feed potential 216, the current flows from the first feeder 114, through the current thin-film transistor 122, the pixel electrode 115, and the organic EL device 135 to the second feeder 116.

The actual operation of organic EL display apparatuses with thin-film transistors is not as simple as that described above and the devices operate under more complex relationships of voltages and currents. Similarly and qualitatively, however, the above description holds true.

FIG. 19 is a sectional view of the organic EL display apparatus having a conventional thin-film transistor. FIG. 20 is a plan view of the organic EL display apparatus having the conventional thin-film transistor. A section taken along the line A—A of FIG. 19 corresponds to a section taken along the line A–A' of FIG. 20.

In the organic EL device 135, a current flows from a high-electric-potential-side electrode 165 of the organic EL device through a luminescent material 155 for the organic EL device to a low-electric-potential electrode 175 of the organic EL device. Although PPV, ITO, and Al are respectively employed as the luminescent material for the organic EL device 155, the material for the high electric potential side electrode 165 of the organic EL device, and the material for the low-electric-potential electrode 175 of the organic EL device in this example, other materials may also be used.

In the conventional example, in which an AC voltage is applied between the source terminal and the drain terminal of the switching thin-film transistor 121, to cause an alternating current to flow, a DC voltage is applied between the source terminal and the drain terminal of the current thin-film transistor 122 to disadvantageously cause a direct current to flow. This is due to an asymmetric configuration optimizing the materials of the high and low-potential-side in order to improve the luminous efficiency of the organic EL device 135; the organic EL device emits light because of the DC voltage being applied causing the direct current to flow. However, when a DC voltage is applied not only to the organic EL device but also to the thin-film transistor or a direct current flows, a rapid deterioration of the thin-film transistor over time will be caused.

On the other hand, an AC voltage may also be applied between the source terminal and the drain terminal of the current thin-film transistor 122. In this case, an alternating current will not flow through the organic EL device 135, but only a one-way current flow, because of the rectification of the organic EL device 135. In other words, the organic EL device 135 emits light in one direction, while it does not emit light in the other direction, so that the luminous efficiency deteriorates. Thus it requires an increase in power consumption to obtain the same amount of light emission as in the case in which a DC voltage is applied to cause a direct current to flow.

SUMMARY OF THE INVENTION

Thus, an object of this invention is to reduce deterioration over time of a switching element such as a thin-film transistor in a current driving type emissive apparatus such as an organic EL display device having a thin-film transistor. Another object of this invention is to reduce in deterioration over time of a switching element such as a thin-film transistor, and to simultaneously achieve both improvement in luminous efficiency and reduction in power consumption.

To solve the above problems, a first aspect of this invention consists of a plurality of scanning lines, a plurality of data lines, and thin-film transistors and a luminescent element formed in a manner such that they correspond to each intersection of the scanning lines and the data lines, wherein an AC voltage is applied between source and drain terminals of the thin-film transistors and wherein a DC voltage is applied between first and second terminals of the luminescent element.

In accordance with this invention, as discussed above not only reduction in the deterioration of thin-film transistors over time due to a direct current, but also improvement of the luminous efficiency of the luminescent elements can be realized.

A second aspect of the invention consists of plurality of scanning lines, a plurality of data lines, and thin-film transistors and a luminescent element formed in a manner such that they correspond to each intersection of the scanning lines and the data lines, wherein an alternating current flows between source and drain terminals of the thin-film transistors and wherein a direct current flows between first and second terminals of the luminescent element.

In accordance with this invention, as discussed above not only reduction in deterioration of thin-film transistors over time due to a direct current, but also improvement of the luminous efficiency of the luminescent element can be realized.

A third aspect of the invention is a current driving type emissive apparatus which consists of a plurality of scanning lines, a plurality of data lines, a first feeder, and a second feeder, the current driving type emissive apparatus having in correspondence with each intersection of the scanning lines and the data lines, a first switching element, a second switching element, a storage capacitor, a pixel electrode and a luminescent element, the first switching element controlling conduction between the data lines and the storage capacitor by means of a potential of the scanning lines, the second switching element controlling conduction between the first feeder and the pixel electrode by means of a potential of the storage capacitor, to thereby control a current flowing through the luminescent element arranged between the pixel electrode and the second feeder, wherein the luminescent element consists of a first luminescent element that emits light by a current flowing from the pixel electrode to the second feeder and a second luminescent element that emits light by a current flowing from the second feeder to the pixel electrode, and wherein the first and the second luminescent elements are arranged in parallel.

In accordance with the invention, as discussed above when the potential for the first feeder across the second feeder is inverted at predetermined intervals, an AC voltage is applied between the source and the drain terminals of the second switching element, causing an alternating current to flow. Then since a deterioration of the second switching element over time due to a DC voltage or a direct current can be reduced, and either of the first luminescent element or the second luminescent element can emit light, the power consumption can decrease without deterioration of the luminous efficiency.

A fourth aspect of the invention, is a current driving type emissive display apparatus which consists of plurality of scanning lines, a plurality of data lines, a first feeder, and a second feeder, the current driving type emissive display apparatus further having, in correspondence with each intersection of the scanning lines and the data lines, a first switching element, a second switching element, a storage capacitor, a pixel electrode and a luminescent element, wherein the first switching element controls conduction between the data lines and the storage capacitor by means of a potential of the scanning lines, the second switching element controls conduction between the first feeder and the pixel electrode by means of a potential of the storage capacitor, to thereby control a current flowing through the luminescent element arranged between the pixel electrode and the second feeder, wherein the luminescent element and a rectifier are arranged in parallel between the pixel electrode and the second feeder, wherein the luminescent element emits light by a current flowing from the pixel electrode to the second feeder, and wherein the rectifier is formed in a manner such that a current flows from the second feeder to the pixel electrode.

In accordance with the invention, as discussed above an AC voltage is applied between the source and the drain terminals of the first switching element and the second switching element causing an alternating current to flow, and a direct current flows between the first and the second terminals of the luminescent element. Since a luminescent element emits light by a current flowing from the pixel electrode to the second feeder, and the rectifier is constructed in a manner such that a current flows from the second feeder to the pixel electrode, deterioration of the second switching element over time due to a direct current or a DC voltage can be prevented.

A fifth a aspect of the invention is a current driving type emissive display apparatus which consists of a plurality of scanning lines, a plurality of data lines, a first feeder, and a second feeder, the current driving type emissive display apparatus further having, in correspondence with each intersection of the scanning lines and the data lines, a first switching element, a second switching element, a storage capacitor, a pixel electrode and a luminescent element, wherein the first switching element controls the conduction between the data lines and the storage capacitor by means of a potential of the scanning lines, and the second switching element controls the conduction between the first feeder and the pixel electrode by means of a potential of the storage capacitor, to thereby control a current flowing through the luminescent element arranged between the pixel electrode and the second feeder, wherein the luminescent element and a rectifier are arranged in parallel between the pixel electrode and the second feeder, wherein the luminescent element emits light by a current flowing from the second feeder to the pixel electrode, and wherein the rectifier is formed in a manner such that a current flows from the pixel electrode to the second feeder.

In accordance with the invention, as discussed above when a luminescent element emits light by a current flowing from the second feeder to the pixel electrode, and the rectifier is constructed in a manner such that a current flows from the pixel electrode to the second feeder, deterioration over time due to a DC voltage or a direct current can be reduced.

A sixth aspect of the invention is a current driving type emissive display apparatus which consists of a plurality of scanning lines, a plurality of data lines, a first feeder, and a second feeder, the current driving type emissive display apparatus further having, in correspondence with each intersection of the scanning lines and the data lines, a first switching element, a second switching element, a storage capacitor, a pixel electrode and a luminescent element, wherein the first switching element controls conduction between the data lines and the storage capacitor by means of a potential of the scanning lines, wherein the second switching element controls conduction between the first feeder and the pixel electrode by means of a potential of the storage capacitor, to thereby emit light by a current following through the luminescent element, which is arranged between the first electrode connected to the pixel electrode and the second electrode connected to the second feeder, the current driving type emissive display apparatus further consisting of of a first rectifier constructed so as to cause a current to flow from the pixel electrode to the first electrode, a second rectifier constructed so as to cause a current to flow from the second electrode to the pixel electrode, a third rectifier constructed so as to cause a current to flow from the second feeder to the first electrode, and a fourth rectifier constructed so as to cause a current to flow from the second electrode to the second feeder, and wherein the luminescent element emits light by a current flowing from the first electrode to the second electrode.

This invention enables reduction in deterioration of the second switching element over time due to a DC voltage and a direct current.

A seventh aspect of the invention, relates to a method for driving a current driving type emissive display apparatus as discussed above wherein a voltage between the first feeder and the second feeder is inverted at predetermined intervals.

This invention can realize a direct current caused to flow through a luminescent element, and simultaneously an AC voltage applied between the source and drain terminals of the second switching element causing an alternating current to flow. Additionally, there can be realized a decrease in the deterioration of the second switching element over time due to a DC voltage or a direct current, and simultaneously, the luminous efficiency can be improved and by emitting a luminescent element during both inverting periods of the potential between the first feeder and the second feeder, the power consumption can be reduced.

An eighth aspect of the invention, relates to a method for producing a current driving type emissive display apparatus discussed above, wherein at least one of the rectifiers, the first rectifier, the second rectifier, the third rectifier, and the fourth rectifier consists of a switching element for rectification connected to a gate, a source, or a drain terminal, and wherein the switching element for rectification is formed simultaneously with at least one of the first and the second switching elements.

A ninth aspect of the invention, is a current driving type emissive display apparatus discussed above wherein at least one of the rectifiers, the first rectifier, the second rectifier, the third rectifier, and the fourth rectifier is formed by a PN junction or a PIN junction, and formed simultaneously with at least one of the first and the second switching elements.

This configuration can realize a reduction in the deterioration of the second switching element over time due to a DC voltage or a direct current, and also improvement of the luminous efficiency and reduction in the power consumption by permitting a luminescent element to emit light during both periods of inversion of the potential between the first feeder and the second feeder, without an additional producing process.

DETAILED DESCRIPTION OF PREFERRED EMBODIMENTS

Several preferred embodiments of this invention will be described with reference to the drawings hereinafter.

First Embodiment

Figure 1:
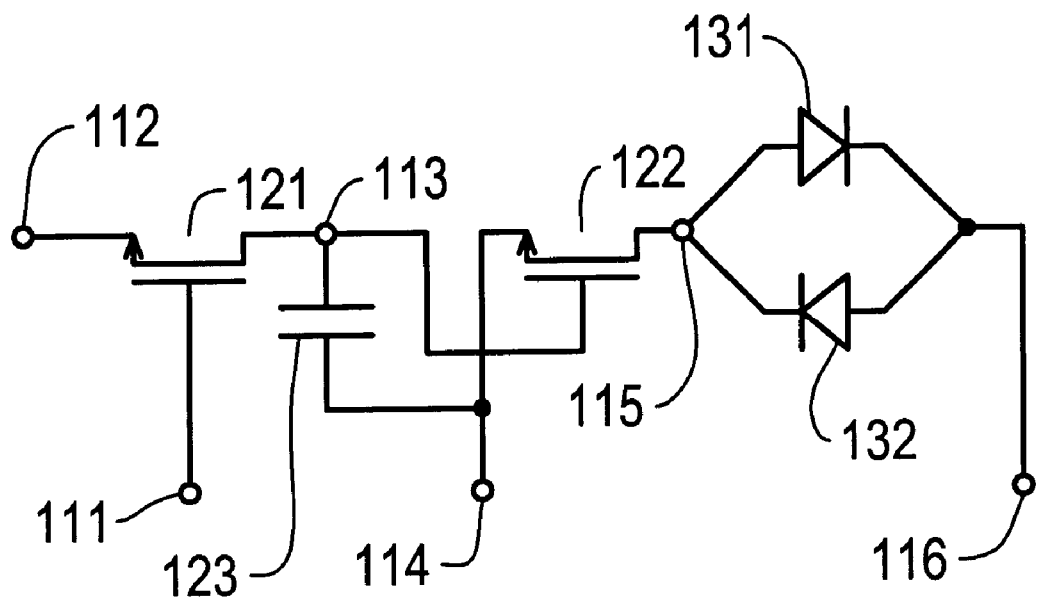
FIG. 1 is an equivalent circuit diagram of one pixel of an organic EL display device as one example of a current driving type emissive display apparatus having a switching element such as a thin-film transistor of a first embodiment of this invention.
Figure 2:
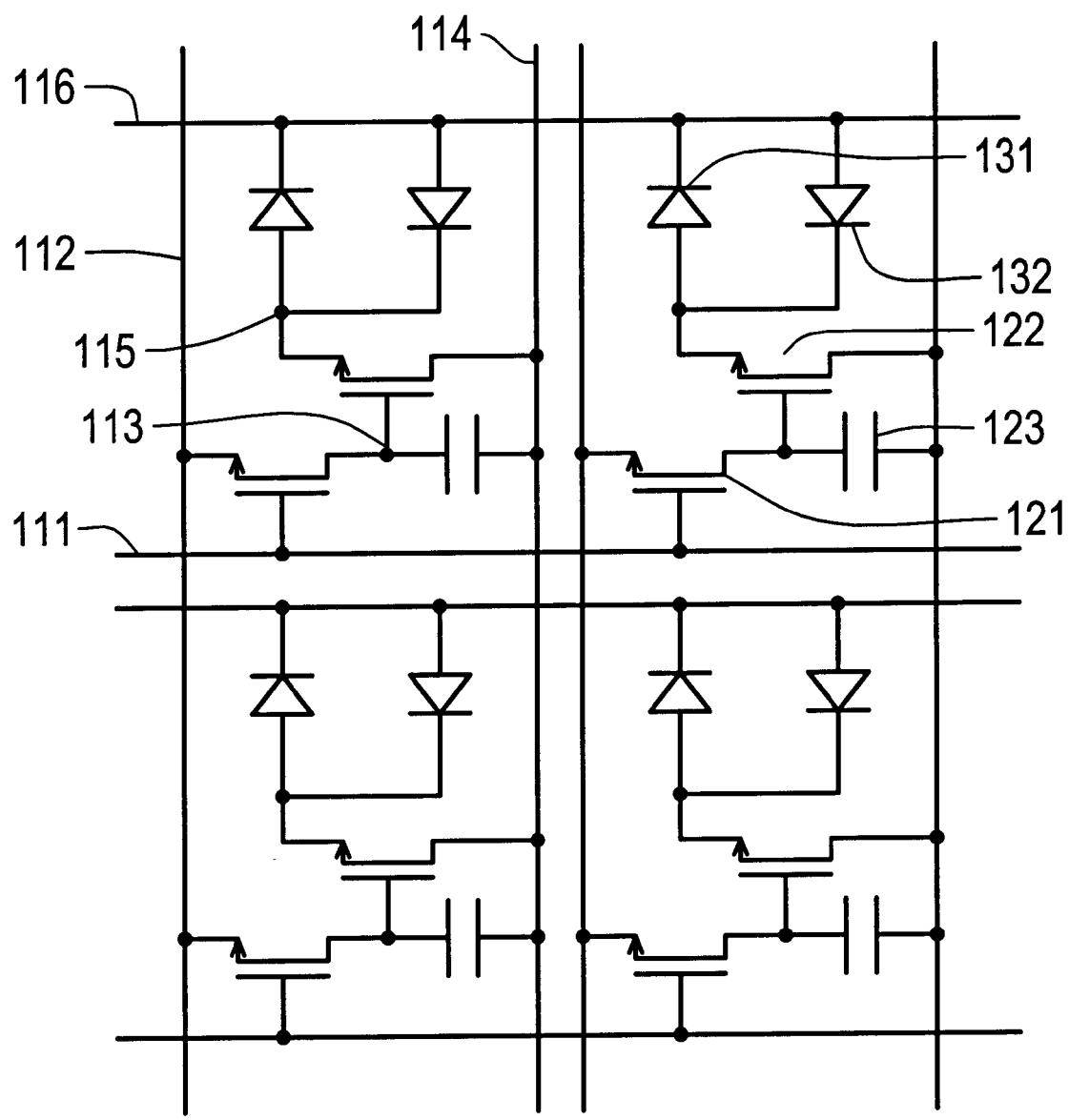
FIG. 2 is an equivalent circuit diagram showing a matrix construction of the organic EL display device having the thin-film transistor of the first embodiment of this invention.
Figure 3:
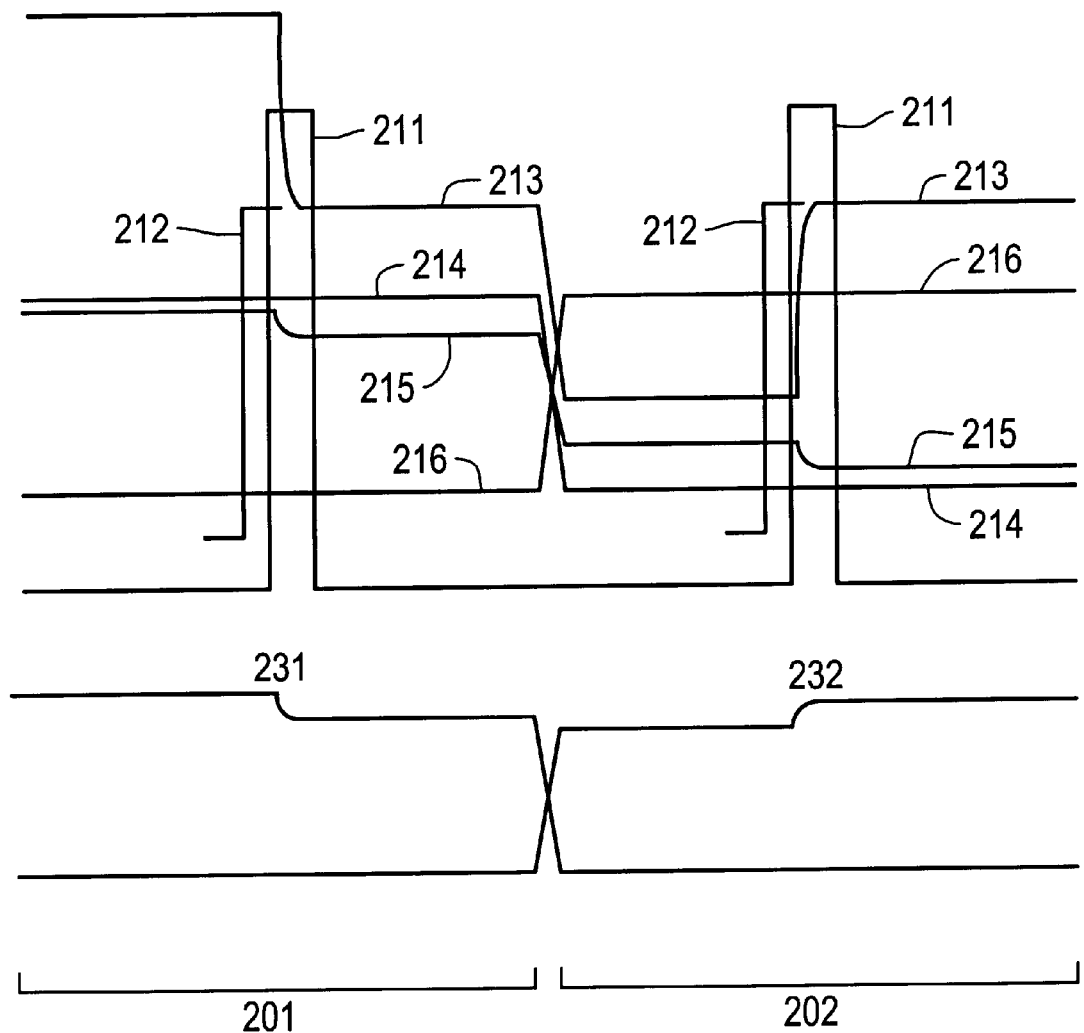
FIG. 3 is a driving voltage diagram of the organic EL display device having the thin-film transistor of the first embodiment of this invention.

FIG. 1 is an equivalent circuit diagram of one pixel of an organic EL display device having a thin-film transistor according to a first embodiment of this invention, FIG. 2 is an equivalent circuit diagram showing the matrix construction of an organic EL display device equipped with a thin-film transistor according to the first embodiment of this invention, and FIG. 3 is a driving voltage diagram of an organic EL display device having a thin-film transistor according to the first embodiment of this invention.

The operation of the organic EL display device having the thin-film transistor of this embodiment will be described with reference to FIGS. 1, 2, and 3.

As shown in FIGS. 1 and 2, a data line 112 is formed so as to extend perpendicular to the direction of a scanning line 111. The scanning line 111 is connected to a gate electrode of a first switching element (hereinafter referred to as a "switching thin-film transistor"), and one of a source or a drain of the switching thin-film transistor 121 is connected to the data line 112. The other of the source or the drain of the switching thin-film transistor 121 is connected to an electrode 113 of a storage capacitor 123, while another electrode of the storage capacitor 123 is connected to a first feeder 114.

A gate electrode of a second switching element (hereinafter referred to as a "current thin-film transistor"), is electrically connected to the storage capacitor 123, and one of the source or the drain regions of the current thin-film transistor 122 is electrically connected to the first feeder. The other of the source or the drain regions of the current thin-film transistor 122 is electrically connected to an electrode (pixel electrode) 115 of an organic EL device 131 or 132. The first feeder is maintained at a fixed potential. Although in this embodiment the construction is such that the first feeder is connected to both the other electrode of the storage capacitor 123 and one of the source or the drain regions of the current thin-film transistor 122, the other electrode of the storage capacitor 123 and the one of the source or drain regions of the current thin-film transistor 122 may also be connected to separate wirings having fixed potentials instead of a common first feeder.

When the switching thin-film transistor 121 is selected by a scanning signal supplied to the scanning line 111, and the organic EL display device constructed in the manner. described above is thereby turned ON, an image signal from the data line 112 is written to the storage capacitor 123 through the switching thin-film transistor 121. In a pixel in a displaying condition, a current flows from the first feeder 114 through the current thin-film transistor 122 and the pixel electrode 115 to a second feeder 116, or a current flows in the reverse direction, and the organic EL device 131 or the organic EL device 132, arranged in parallel, emits light. In other words, in this embodiment, in which the organic EL devices 131 and 132 are arranged in parallel, and the two organic EL devices are comprised of the organic EL device 131 (hereinafter referred to as a "forward oriented organic EL device") which emits light by a current flowing from the pixel electrode 115 to the second feeder 116 and the organic EL device 132 (hereinafter referred to as a "reverse oriented organic EL device") which emits light by a current flowing from the second feeder 116 to the pixel electrode 115. In a pixel in a non-displaying condition, no current flows, and the organic EL devices do not emit light.

Here, as one example of a system in which the sign (+or −) of the first feeder with respect to that of the second feeder is inverted at predetermined intervals, a system in which inversion is effected for each vertical scanning period, that is, a frame inversion system, will be described with reference to FIG. 3.

Since the potential 214 of the first feeder 114 is higher than the potential 216 of the second feeder 116 in an odd-number frame 201, a current flows from the first feeder 114, through the current thin-film transistor 122, the pixel electrode 115, and the forward oriented organic EL device 131 to the second feeder 116. Since the first feed potential 214 is lower than the second feed potential 216 in an even-number frame 202, a current flows from the second feeder 116 through the reverse oriented organic EL device 132, the pixel electrode 115, and the current thin-film transistor 122 to the first feeder 114.

Although the signal potentials 212 of an odd-number frame 221 and an even-number frame 222 are equal in this case, they may also be different from each other. In FIG. 3, only the signal potential 212 before and after the building up of the potential of a gate electrode 211 is shown and the other potentials are omitted. The first feed potential 214 of the odd-number frame 201 is equal to the second feed potential 216 of the even-number frame 202, and the second feed potential 216 of the odd-number frame 201 is equal to the first feed potential 214 of the even-number frame 202 in this case. However, the potentials may be different from each other, as long as the voltage sign of the first feed potential 214 is inverted with respect to that of the second feed potential 216.

In this embodiment, an AC voltage is applied between the source terminal and the drain terminal of the switching thin-film transistor 121, and between the source terminal and the drain terminal of the current thin-film transistor 122, to cause an alternating current to flow, and a direct current flows between the first terminal and the second terminal of the forward oriented organic EL device 131 and between the first terminal and the second terminal of the reverse oriented organic EL device 132. This arrangement makes it possible to achieve a reduction in deterioration over time of the current thin-film transistor 122 due to a DC voltage or a direct current.

In this embodiment, the organic EL device consists of the forward oriented organic EL device 131 and the reverse oriented organic EL device 132, and the forward oriented organic EL device 131 is arranged in such a manner as to emit light by a current flowing from the pixel electrode 115 to the second feeder 116; the reverse oriented organic EL device 132 is arranged in such a manner as to emit light by a current flowing from the second feeder 116 to the pixel electrode 115. Further, the voltage sign of the first feed potential 214 with respect to the second feed potential 216 is inverted at predetermined intervals. This arrangement makes it possible to cause a direct current to flow between the first terminal and the second terminal of the forward oriented organic EL device 131 and between the first terminal and the second terminal of the reverse oriented organic EL device 132. At the same time, this arrangement makes it possible to cause an AC voltage to be applied, between the source terminal and the drain terminal of the current thin-film transistor 122 causing an alternating current to flow. Thus a reduction in deterioration of the thin-film transistor 122 over time due to a DC voltage or a direct current can be realized. Further, either the forward oriented organic EL device 131 or the reverse oriented organic EL device 132 emits light during both periods of the odd-number frame 201 and the even-number frame 202, whereby the luminous efficiency can be improved and the power consumption can be reduced.

Figure 4:
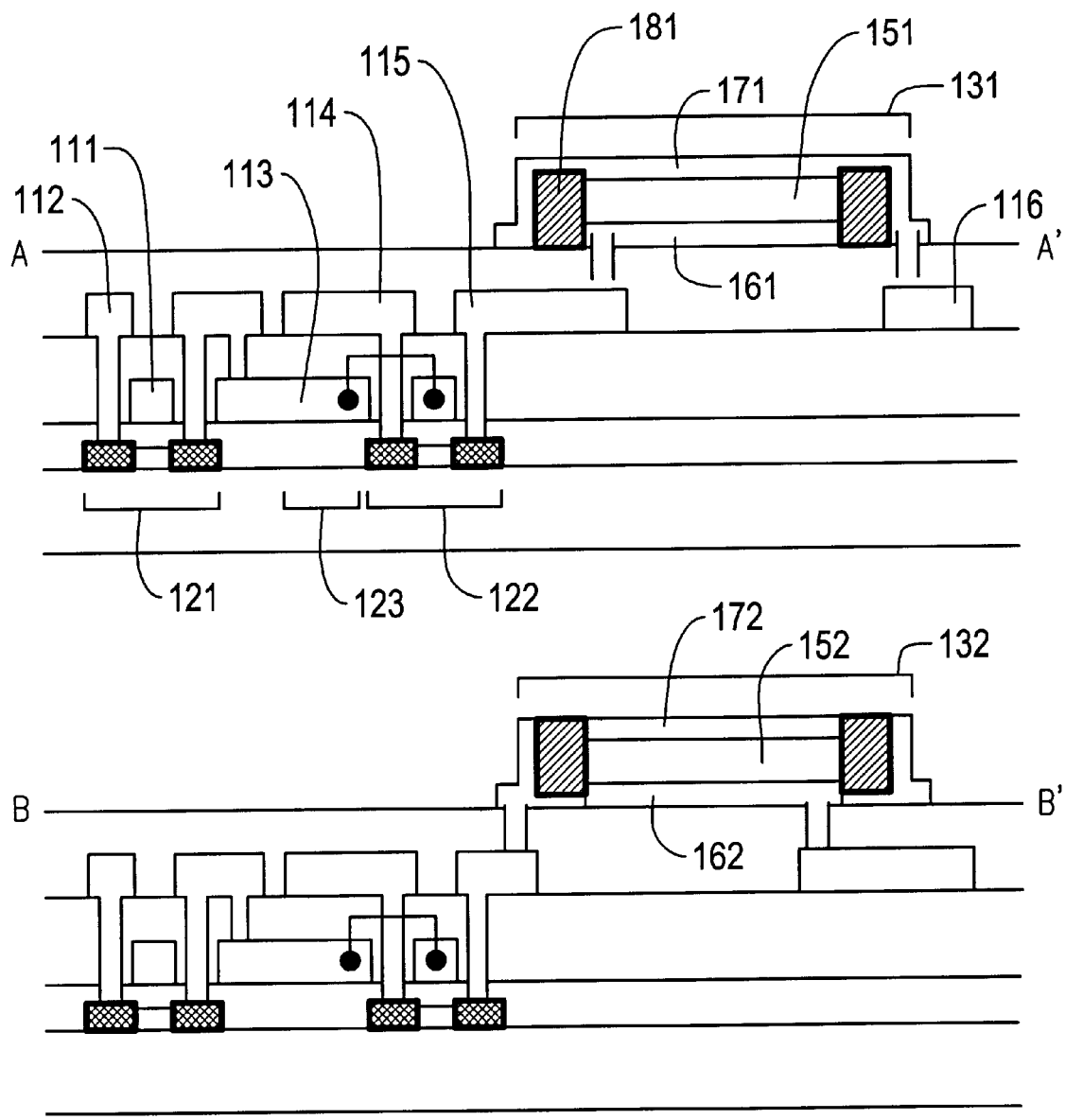
FIG. 4 is a sectional view of the organic EL display device having the thin-film transistor of the first embodiment of this invention.
Figure 5:
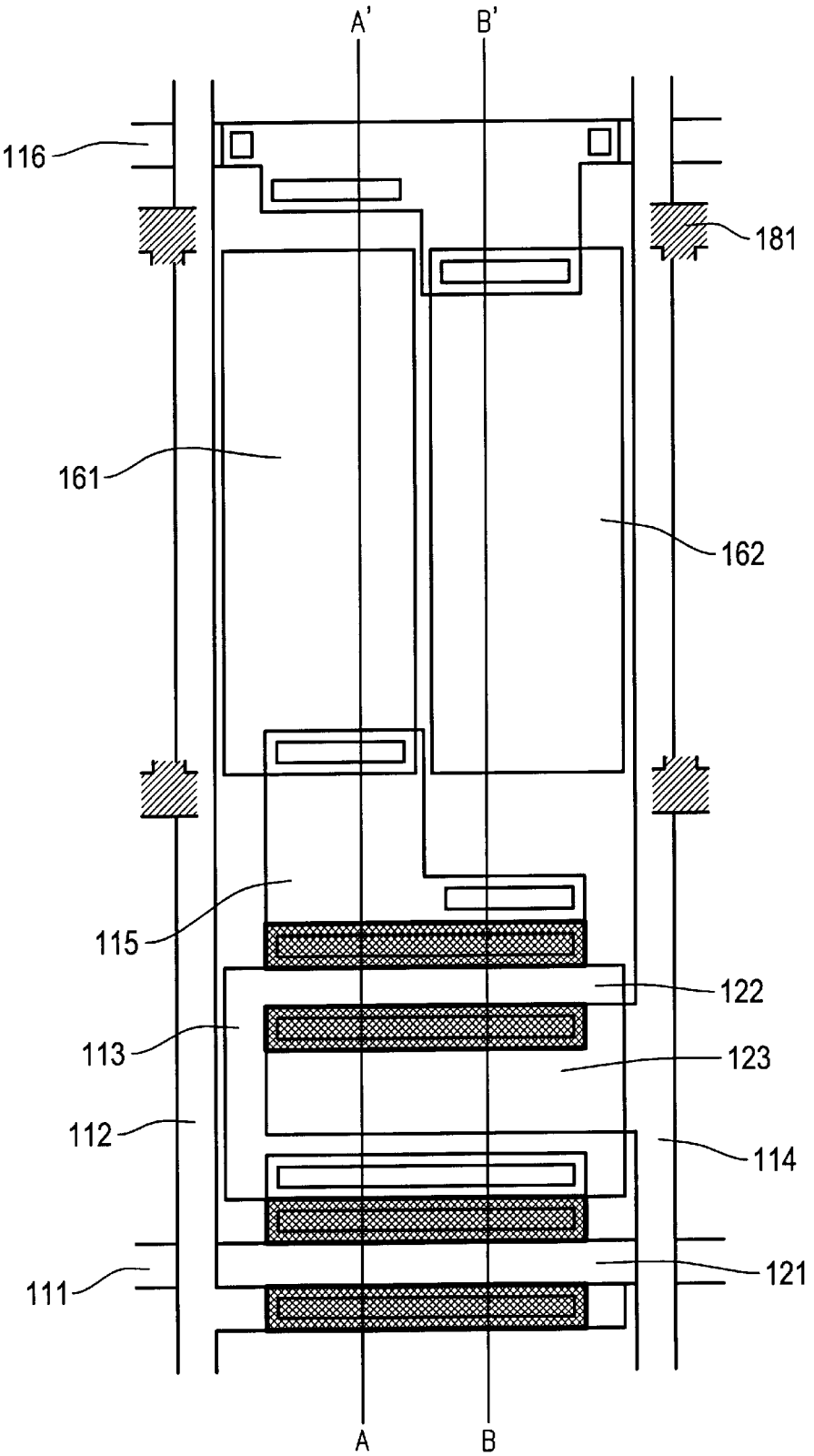
FIG. 5 is a plan view of the organic EL display device having the thin-film transistor of the first embodiment of this invention.

FIG. 4 is a sectional view of the organic EL display device having a thin-film transistor of the first embodiment of this invention. FIG. 5 is a plan view of the organic EL display device having the thin-film transistor of the first embodiment of this invention. Sections taken along the lines A–A' and B–B' of FIG. 4 correspond to the sections taken along the lines A–A' and B–B' of FIG. 5.

In the forward oriented organic EL device 131, a current flows from a high-potential-side electrode 161 of the forward oriented organic EL device through a luminescent layer 151 of forward oriented organic EL device to a low-potential-side electrode 171 of the forward oriented organic EL device. In the reverse oriented organic EL device 132, a current flows from a high-electric- potential-side electrode 162 of the reverse oriented organic EL device through a luminescent layer 152 of reverse oriented organic EL device to a low-potential-side electrode 172 of the reverse oriented organic EL device.

(Second Embodiment)

Figure 6:
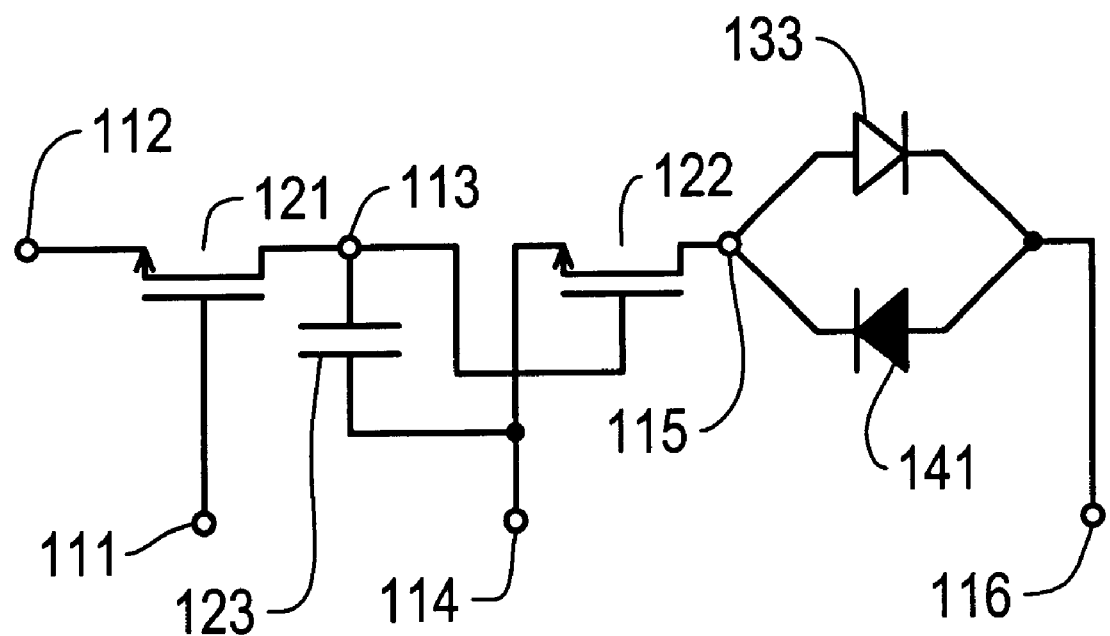
FIG. 6 is an equivalent circuit diagram of one pixel of an organic EL display device having a thin-film transistor of a second embodiment of this invention.
Figure 6:
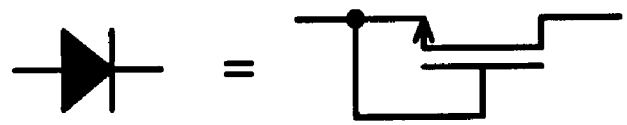
Figure 7:
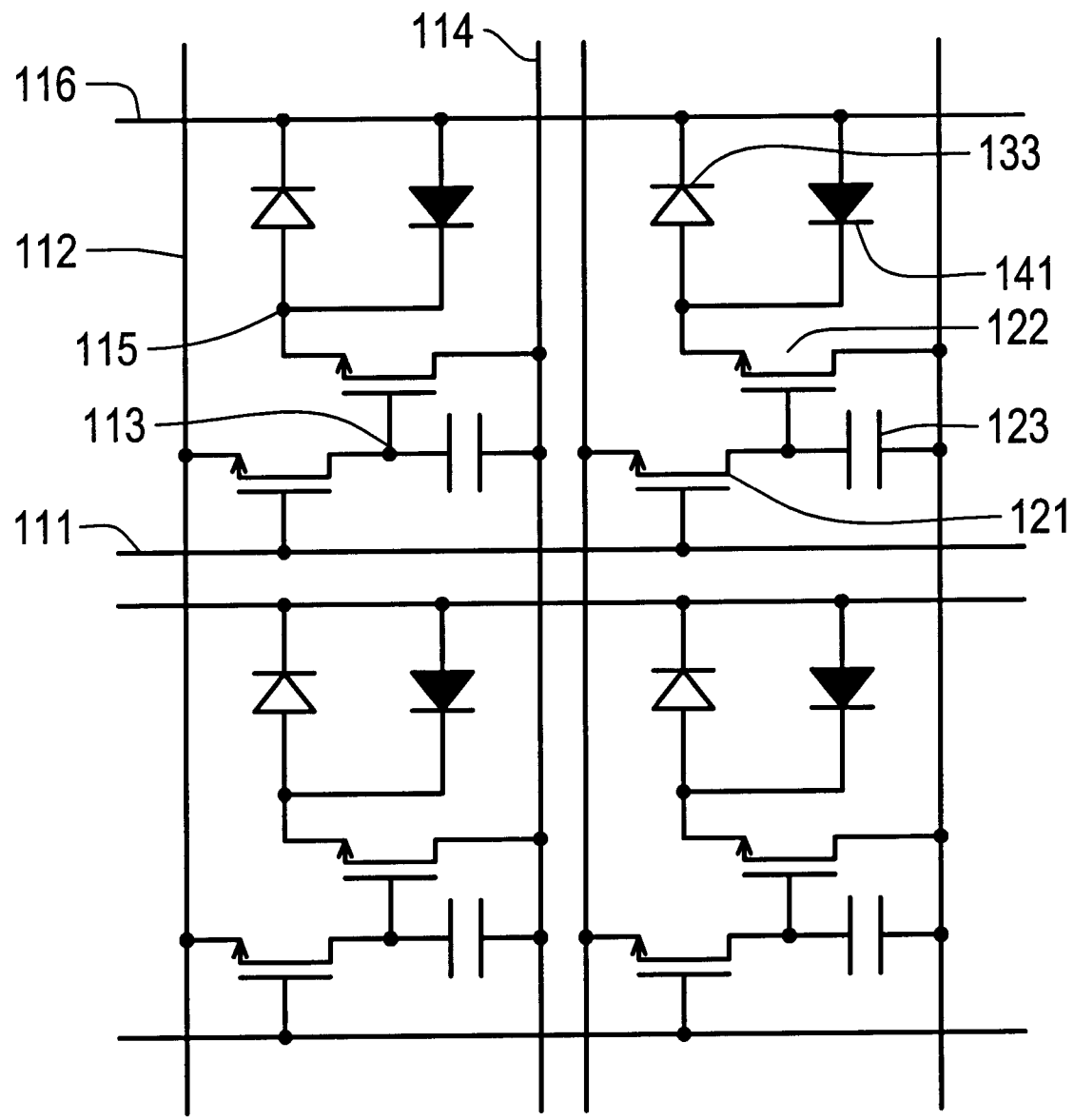
FIG. 7 is an equivalent circuit diagram showing a matrix construction of the organic EL display device comprising the thin-film transistor relating to the second embodiment of the invention.
Figure 8:
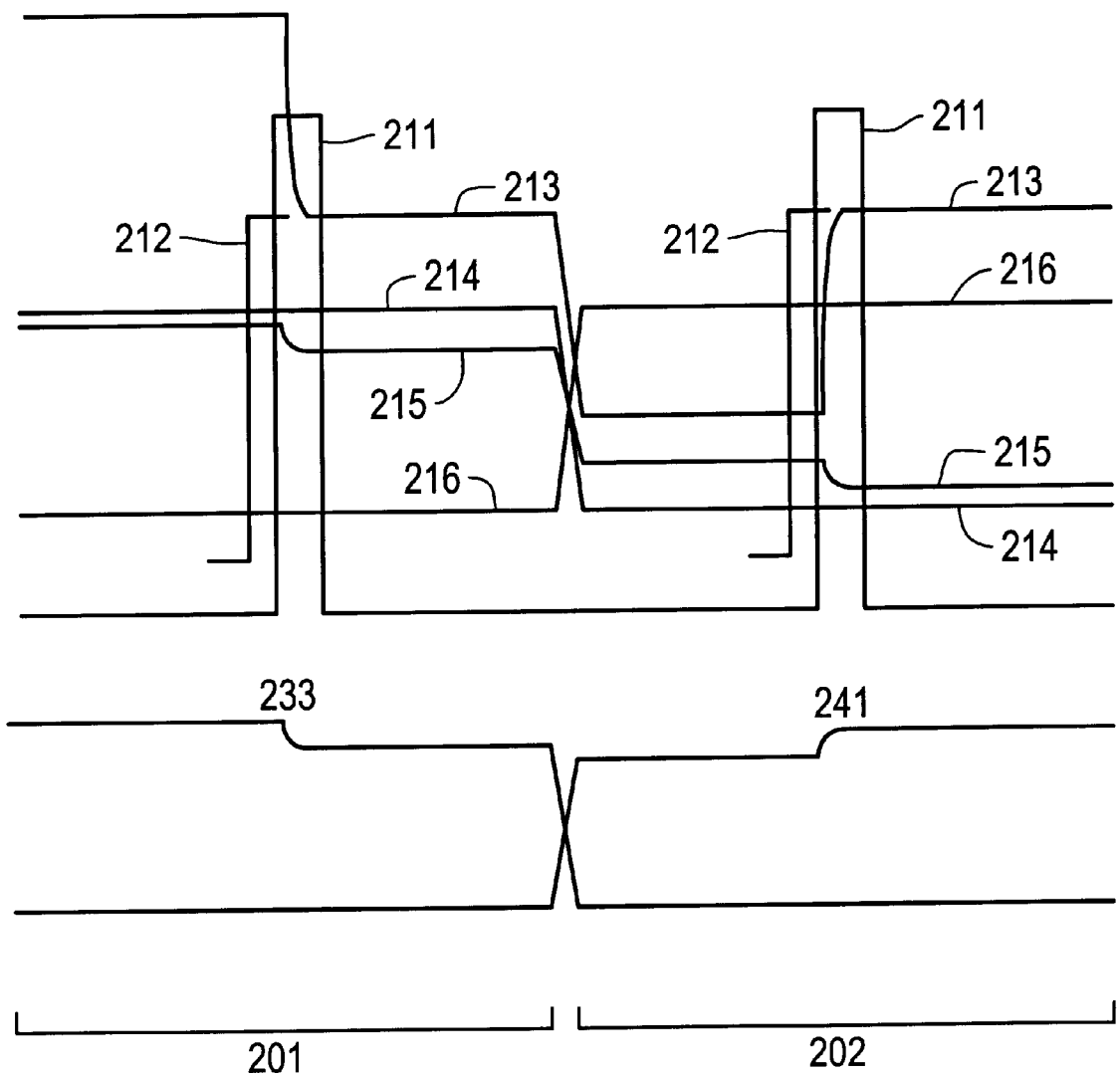
FIG. 8 is a driving voltage diagram of the organic EL display device having the thin-film transistor of the second embodiment of this invention.

FIG. 6 is an equivalent circuit diagram of one pixel of an organic EL display device having a thin-film transistor of a second embodiment of this invention, FIG. 7 is an equivalent circuit diagram showing the matrix construction of the organic EL display device equipped with the thin-film transistor according to the second embodiment of the invention, and FIG. 8 is a driving voltage diagram of the organic EL display device having the thin-film transistor of the second embodiment of this invention.

The operation of the organic EL display device having a thin-film transistor of this embodiment will be described with reference to FIGS. 6, 7, and 8. Since the construction of this embodiment is similar to that of the first embodiment, only those points which differ from the first embodiment will be explained.

The switching thin-film transistor 121, the storage capacitor 123, and the current thin-film transistor 122 operate in the same way as in the first embodiment.

In a pixel in a displaying condition, a current flows from the first feeder 114 through the current thin-film transistor 122 and the pixel electrode 115 to the second feeder 116, and the organic EL device 133 emits light. In a pixel in a non-displaying condition, no current flows, and the organic EL device emits no light.

Since the first feed potential 214 is higher than the second feed potential 216 in an odd-number frame 201, a current flows from the first feeder 114 through the current thin-film transistor 122, the pixel electrode 115, and the organic EL device 133 to the second feeder 116. Since the first feed potential 214 is lower than the second feed potential 216 in an even-number frame 202, a current flows from the second feeder 116 through a rectifier 141, the pixel electrode 115, and the current thin-film transistor 122 to the first feeder 114.

Although the organic EL device 133 is arranged in such a manner as to emit light by a current from the pixel electrode 115 to the second feeder 116, and the rectifier 141 is arranged in such a manner as to cause a current to flow from the second feeder 116 to the pixel electrode 115 in this example, the organic EL device 133 may also be arranged in such a manner as to emit light by a current from the second feeder 116 to the pixel electrode 115, and the rectifier 141 may be arranged in such a manner as to cause a current to flow from the pixel electrode 115 to the second feeder 116.

In this embodiment, an AC voltage is applied between the source terminal and the drain terminal of the switching thin-film transistor 121, and between the source terminal and the drain terminal of the current thin-film transistor 122, to cause an alternating current to flow, and a direct current flows between the first terminal and the second terminal of the organic EL device 133. This arrangement makes it possible to achieve a reduction in deterioration of the current thin-film transistor 122 over time due to a DC voltage or a direct current.

Further in this embodiment, the rectifier 141 is formed, the organic EL device 133 is arranged in such a manner as to emit light by a current flowing from the pixel electrode 115 to the second feeder 116 and the rectifier 141 is arranged in such a manner as to cause a current to flow from the second feeder 116 to the pixel electrode 115. Further the voltage sign of the first feed potential 214 with respect to the second feed potential 216 is inverted at predetermined intervals. This arrangement makes it possible to cause a direct current to flow between the first terminal and the second terminal of the organic EL device 133. At the same time, this arrangement makes it possible to cause an AC voltage to be applied between the source terminal and the drain terminal of the current thin-film transistor 122 causing an alternating current to flow. Thus a reduction in deterioration of the thin-film transistor 122 over time due to a DC voltage or a direct current can be realized.

Figure 9:
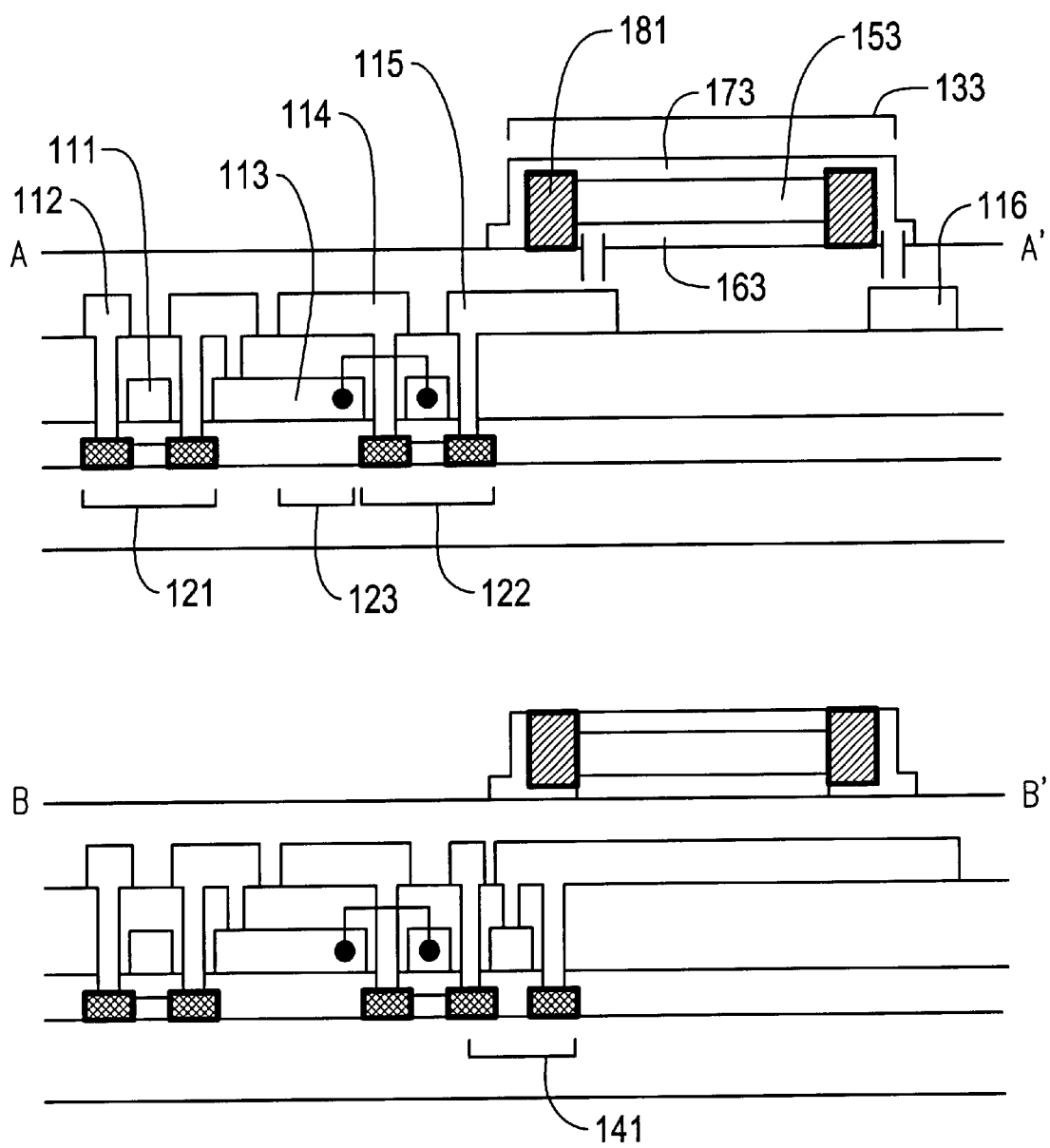
FIG. 9 is a sectional view of the organic EL display device having the thin-film transistor of the second embodiment of this invention.
Figure 10:
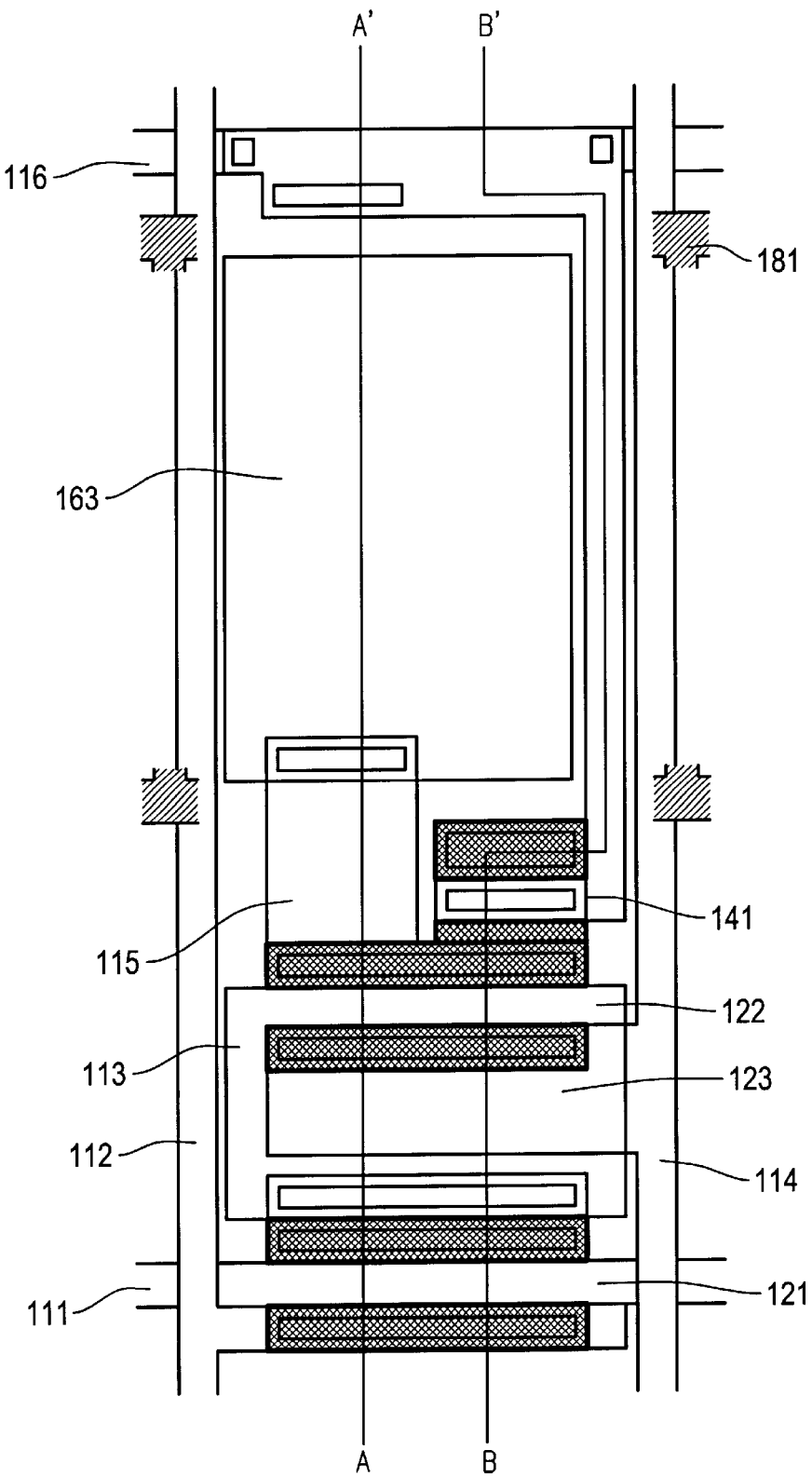
FIG. 10 is a plan view of the organic EL display device having the thin-film transistor of the second embodiment of this invention.

FIG. 9 is a sectional view of the organic EL display device having a thin-film transistor of the second embodiment. FIG. 10 is a plan view of the organic EL display device having the thin-film transistor of the second embodiment. The sections taken along the lines A–A' and B–B' of FIG. 9 correspond to the sections taken along the lines A–A' and B–B' of FIG. 10.

In this embodiment, the rectifier 141 comprises a thin-film transistor for rectification, wherein a gate terminal is connected to a source terminal or a drain terminal. The thin-film transistor for rectification is formed simultaneously with the switching thin-film transistor 121 and the current thin-film transistor 122. This arrangement makes it possible to realize a reduction in deterioration of the current thin-film transistor 122 over time due to a DC voltage or a direct current without involving an additional producing process.

(Third Embodiment)

Figure 11:
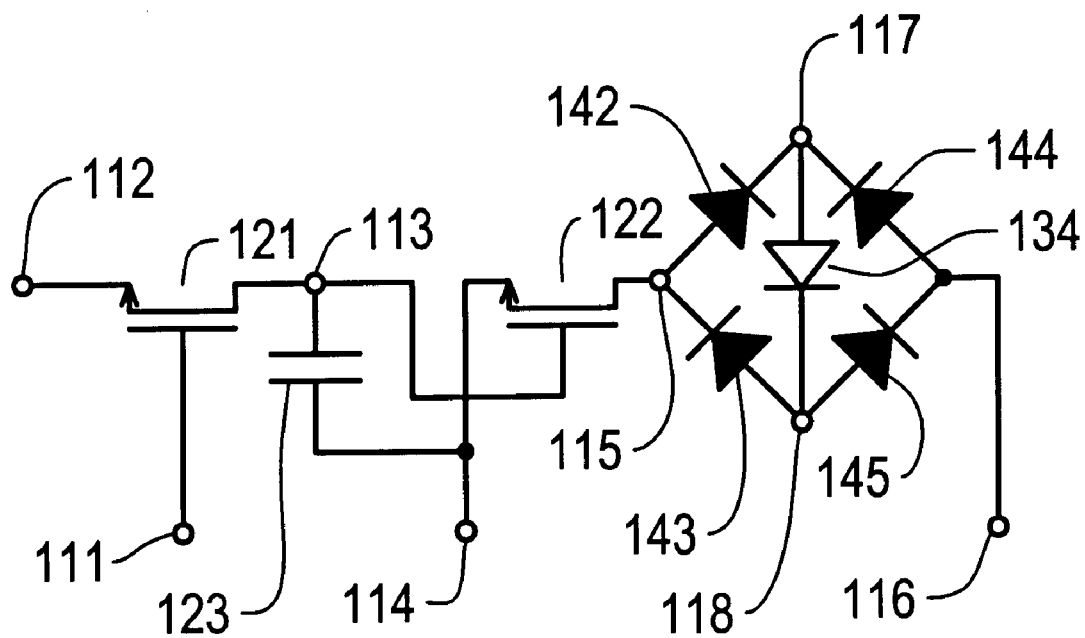
FIG. 11 is an equivalent circuit diagram of one pixel of an organic EL display device having a thin-film transistor of a third embodiment of this invention.
Figure 12:
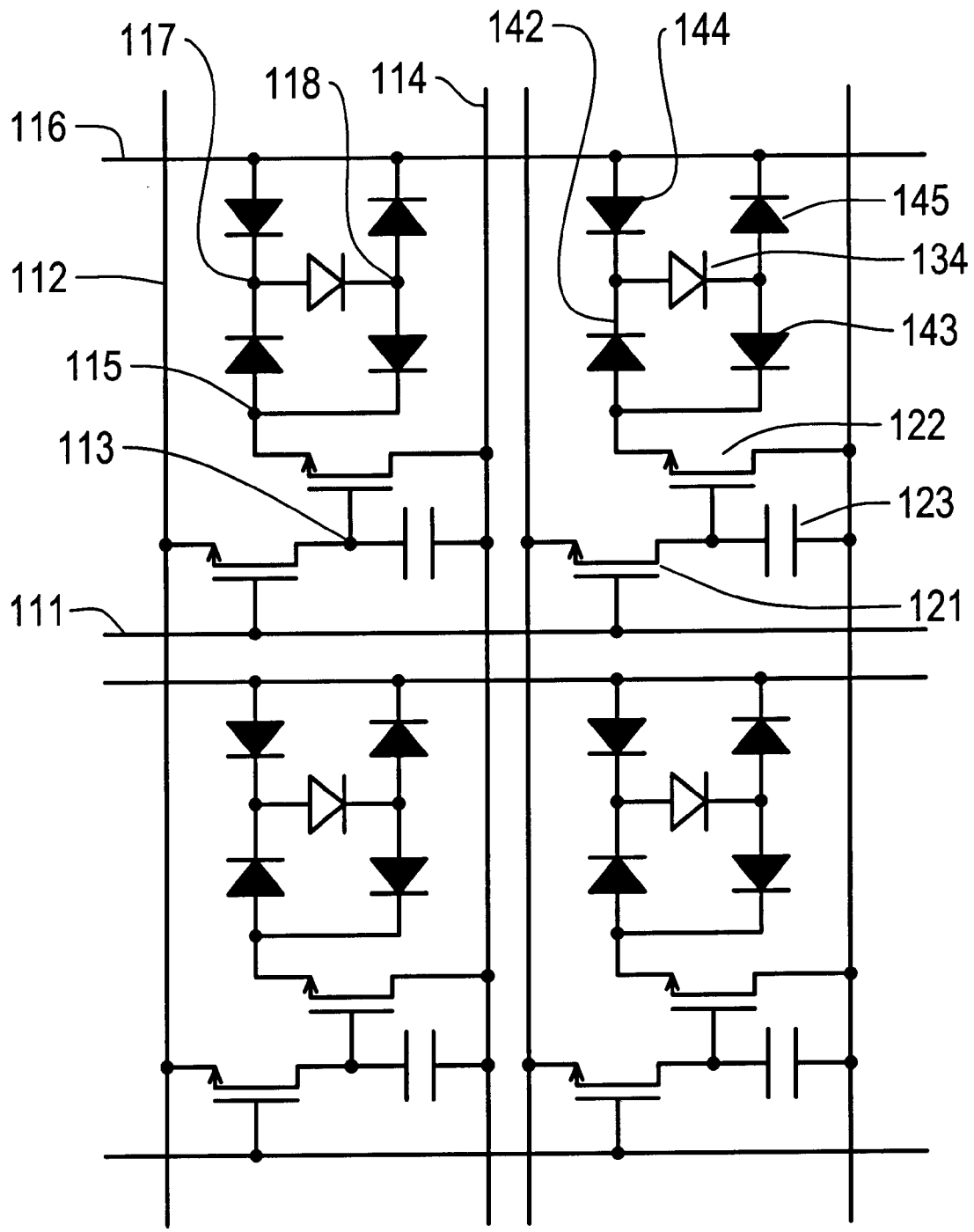
FIG. 12 is an equivalent circuit diagram showing a matrix construction of the organic EL display device having the thin-film transistor of the third embodiment of this invention.
Figure 13:
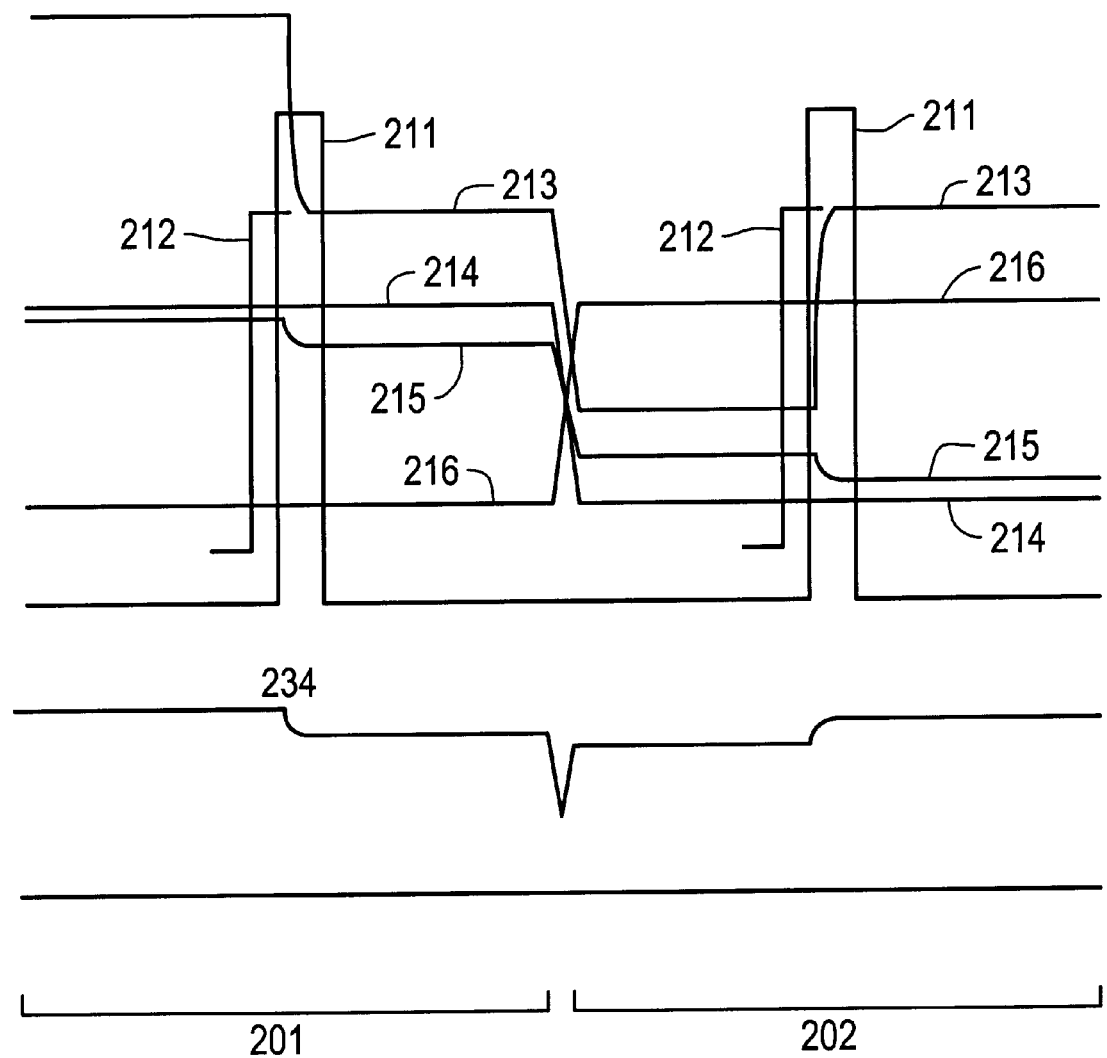
FIG. 13 is a driving voltage diagram of the organic EL display device having the thin-film transistor of the third embodiment of this invention.

FIG. 11 is an equivalent circuit diagram of one pixel of an organic EL display device having a thin-film transistor of a third embodiment of this invention, FIG. 12 is an equivalent circuit diagram showing the matrix construction of the organic EL display device having a thin-film transistor of the third embodiment of the invention, and FIG. 13 is a driving voltage diagram of the organic EL display device having a thin-film transistor of the second embodiment of this invention.

The operation of the organic EL display device having a thin-film transistor of this embodiment will be described with reference to FIGS. 11, 12, and 13. Since the construction of this embodiment is also similar to that of the first embodiment, only those points which differ from the first embodiment will be explained.

The switching thin-film transistor 121, the storage capacitor 123, and the current thin-film transistor 122 operate in the same way as in the first embodiment.

In a pixel in a displaying condition, a current flows from the first feeder 114 through the current thin-film transistor 122 and the pixel electrode 115 to a second feeder 116, and an organic EL device 134 emits light. In a pixel in a non-displaying condition, no current flows, and the organic EL device emits no light.

Since the first feed potential 214 is higher than the second feed potential 216 in an odd-number frame 201, a current flows from the first feeder 114 through the current thin-film transistor 122, the pixel electrode 115, a first rectifier 142, the organic EL device 134 and a fourth rectifier 145 to the second feeder 116. Since the first feed potential 214 is lower than the second feed potential 216 in an even-number frame 202, a current flows from the second feeder 116 through a third rectifier 144, the organic EL device 134, a second rectifier 143, the pixel electrode 115, and the current thin-film transistor 122 to the first feeder 114.

In other words, the first rectifier 142, the second rectifier 143, the third rectifier 144, and the fourth rectifier 145 form a full-wave rectification circuit. A current flows from a first electrode 117 to a second electrode 118 in the organic EL device 134, regardless of the levels of the first feed potential 214 and the second feed potential 216.

In this embodiment, an AC voltage is applied between the source terminal and the drain terminal of the switching thin-film transistor 121! and between the source terminal and the drain terminal of the current thin-film transistor 122, to cause an alternating current to flow, and a direct current flows between the first electrode 117 and the second electrode 118 of the organic EL device 134. This arrangement makes it possible to achieve a reduction in. deterioration of the current thin-film transistor 122 over time due to a DC voltage or a direct current.

Further, in this embodiment, the first electrode 117 and the second electrode 118 are formed, and further, the first rectifier 142, the second rectifier 143, the third rectifier 144, and the fourth rectifier 144 are formed; and the organic EL device 134 is arranged in such a manner as to emit light by a current flowing from the first electrode 117 to the second electrode 118. The first rectifier 142, the second rectifier 143, the third rectifier 144, and the fourth rectifier 145 are arranged in such a manner as to permit current to flow from the pixel electrode 115 to the first electrode 117, from the second electrode 118 to the pixel electrode 115, from the second feeder 116 to the first electrode 117, and from the second electrode 118 to the second feeder 116, respectively. Further, the voltage sign of the first feeder 114 with respect to the second feeder 116 is inverted at predetermined intervals. This arrangement makes it possible to cause a DC voltage to be applied between the first terminal and the second terminal of the organic EL device 134 causing a direct current to flow. Further, this causes an AC voltage to be applied, between the source terminal and the drain terminal of the current thin-film transistor 122 causing an alternating current to flow. Thus a reduction in deterioration of the current thin-film transistor 122 over time due to a DC voltage or a direct current can be realized. At the same time, since the organic EL device 134 emits light during both periods of the odd-number frame 201 and the even-number frame 202, the luminous efficiency can be improved and the power consumption can be reduced.

Figure 14:
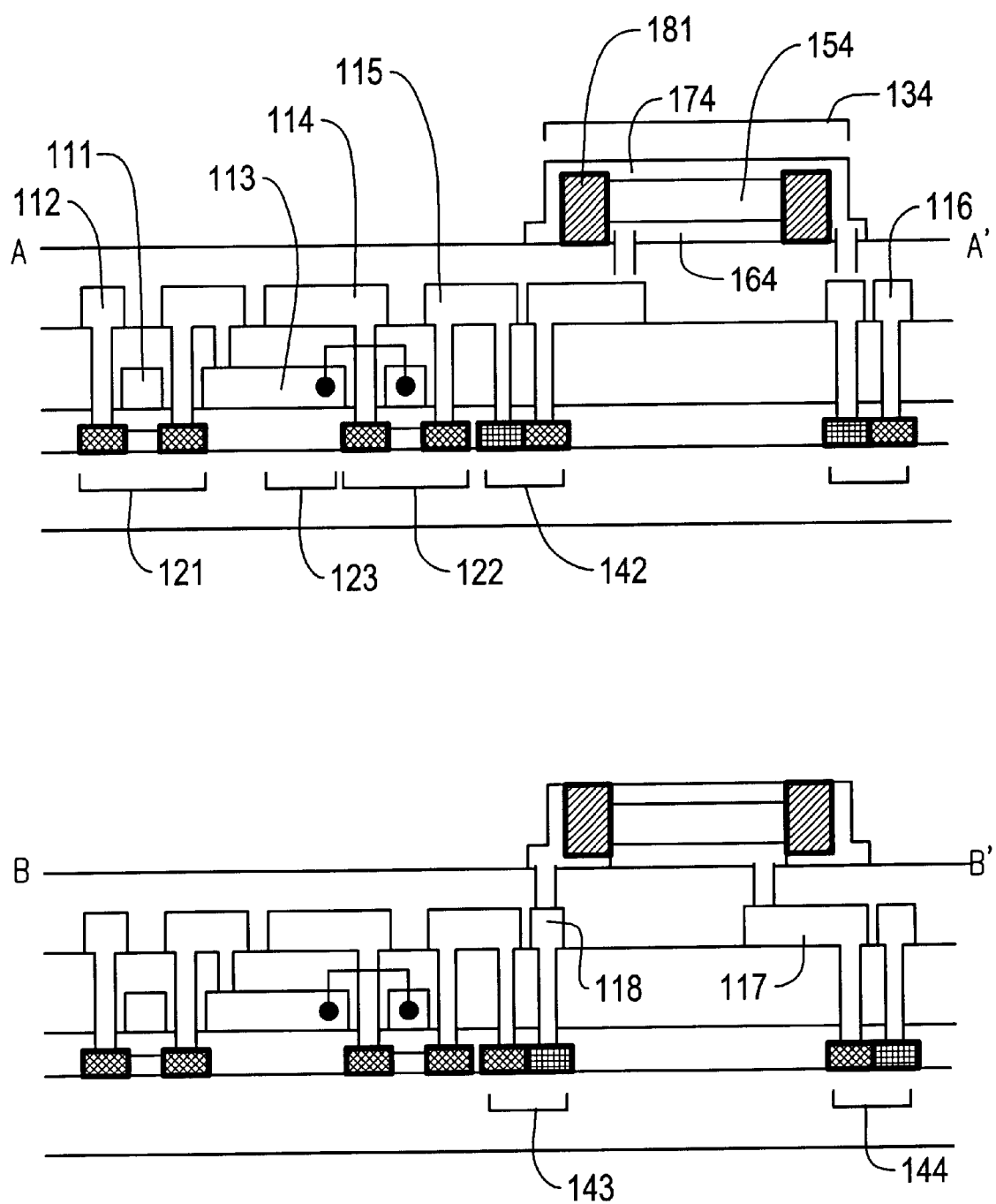
FIG. 14 is a sectional view of the organic EL display device having the thin-film transistor of the third embodiment of this invention.
Figure 15:
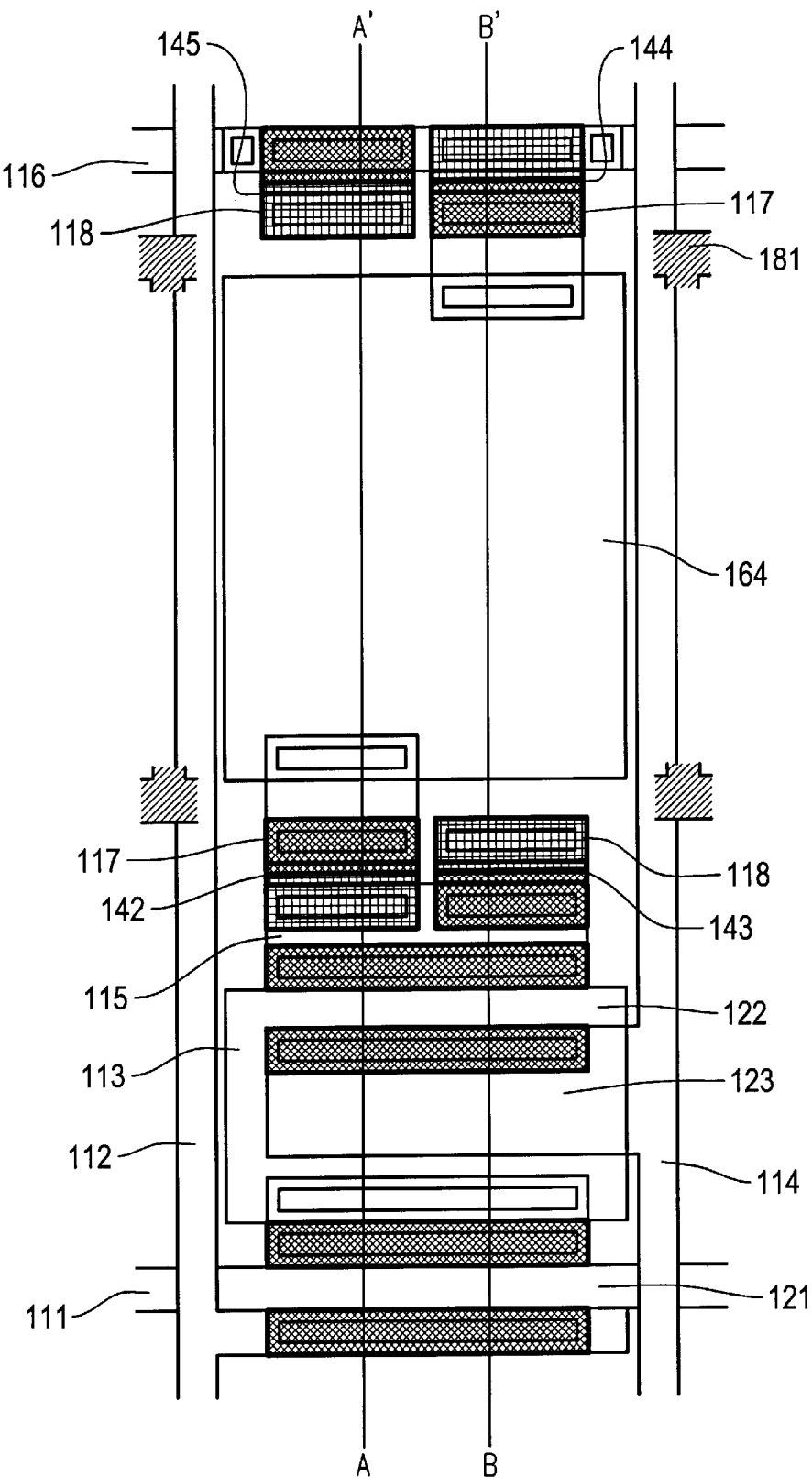
FIG. 15 is a plan view of the organic EL display device having the thin-film transistor of the third embodiment of this invention.
Figure 16:
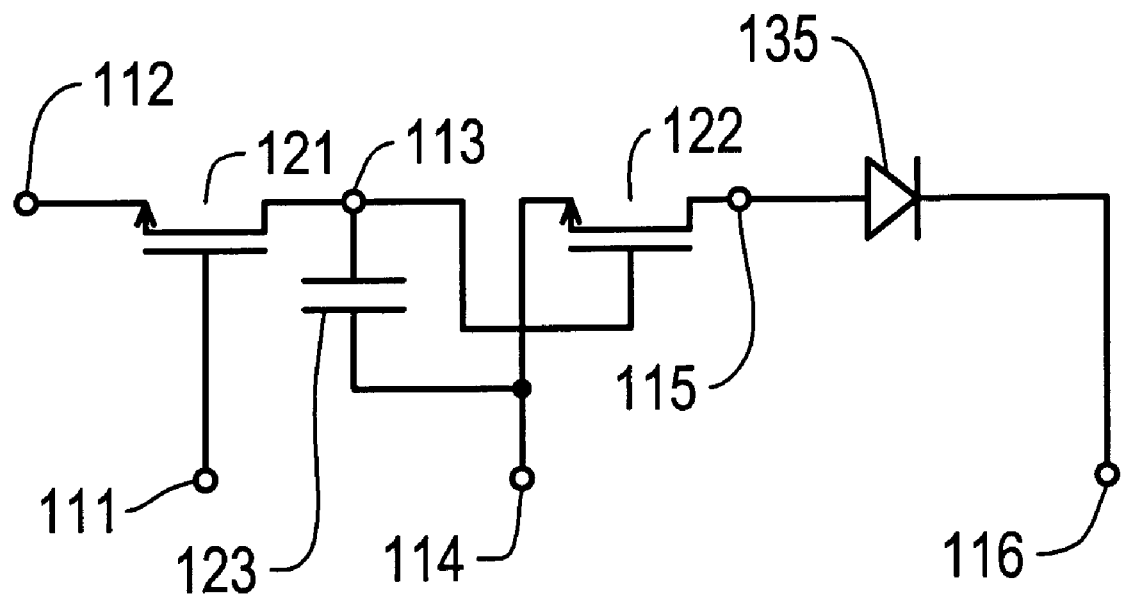
FIG. 16 is an equivalent circuit diagram of one pixel of an organic EL display device having a thin-film transistor of a conventional form.
Figure 17:
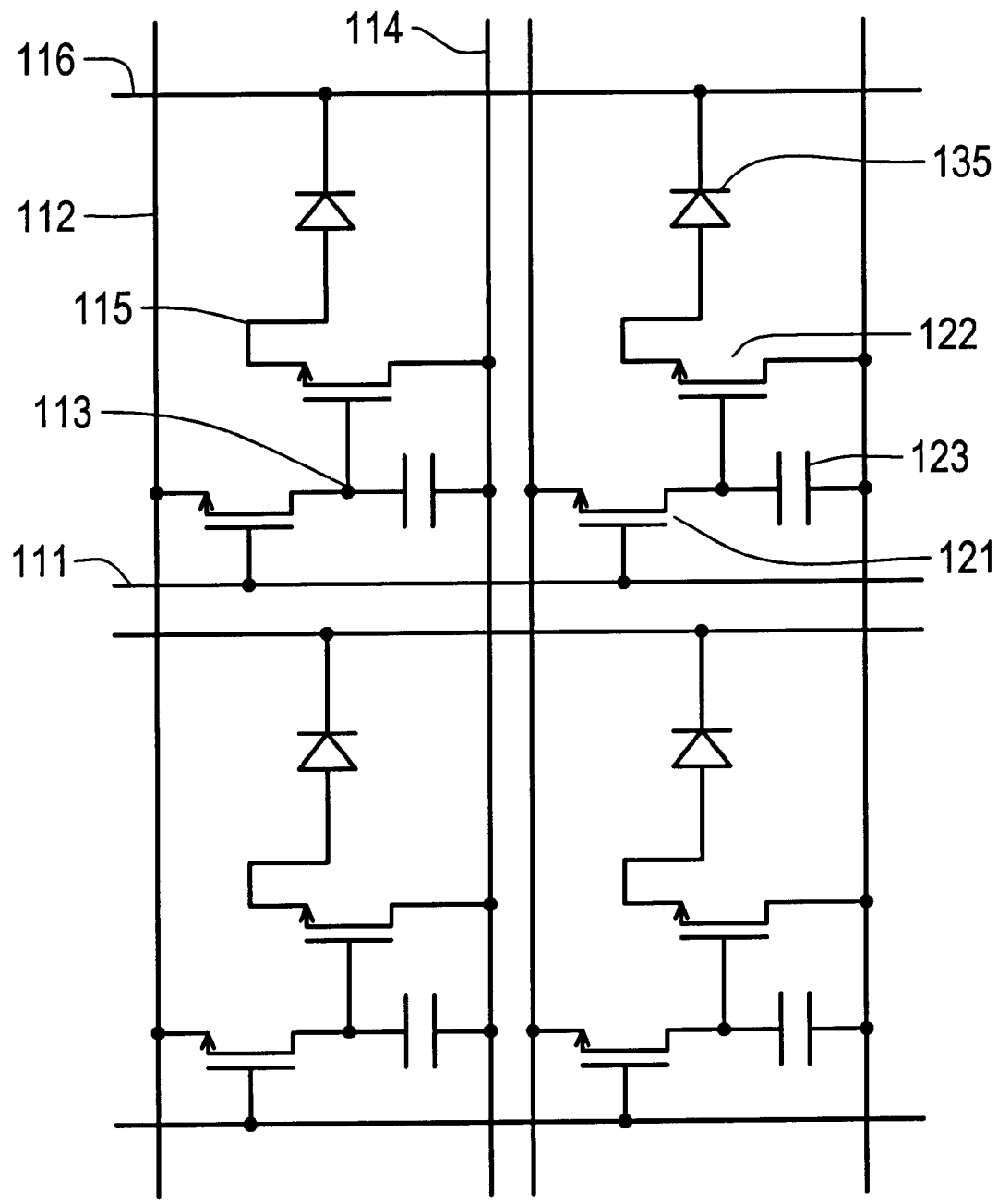
FIG. 17 is an equivalent circuit diagram showing a matrix construction of the organic EL display device having the thin-film transistor of the conventional form.
Figure 18:
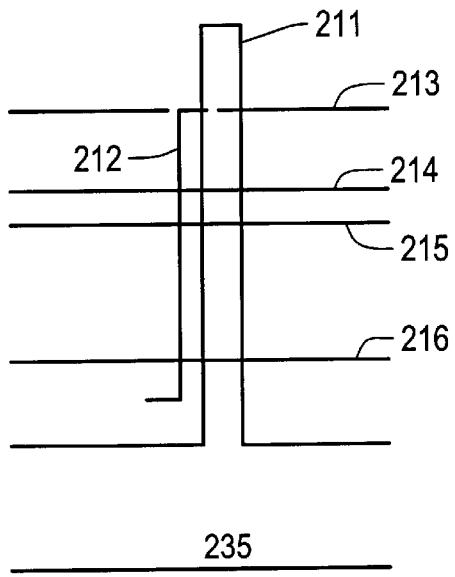
FIG. 18 is a driving voltage diagram of the organic EL display device having the thin-film transistor of the conventional form.
Figure 19:
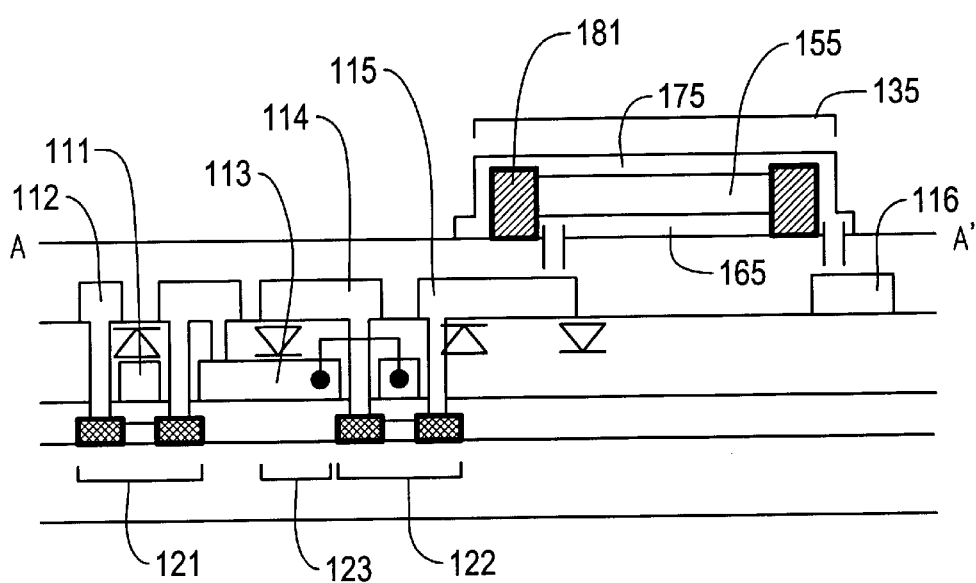
FIG. 19 is a sectional view of the organic EL display device having the thin-film transistor of the conventional form.
Figure 20:
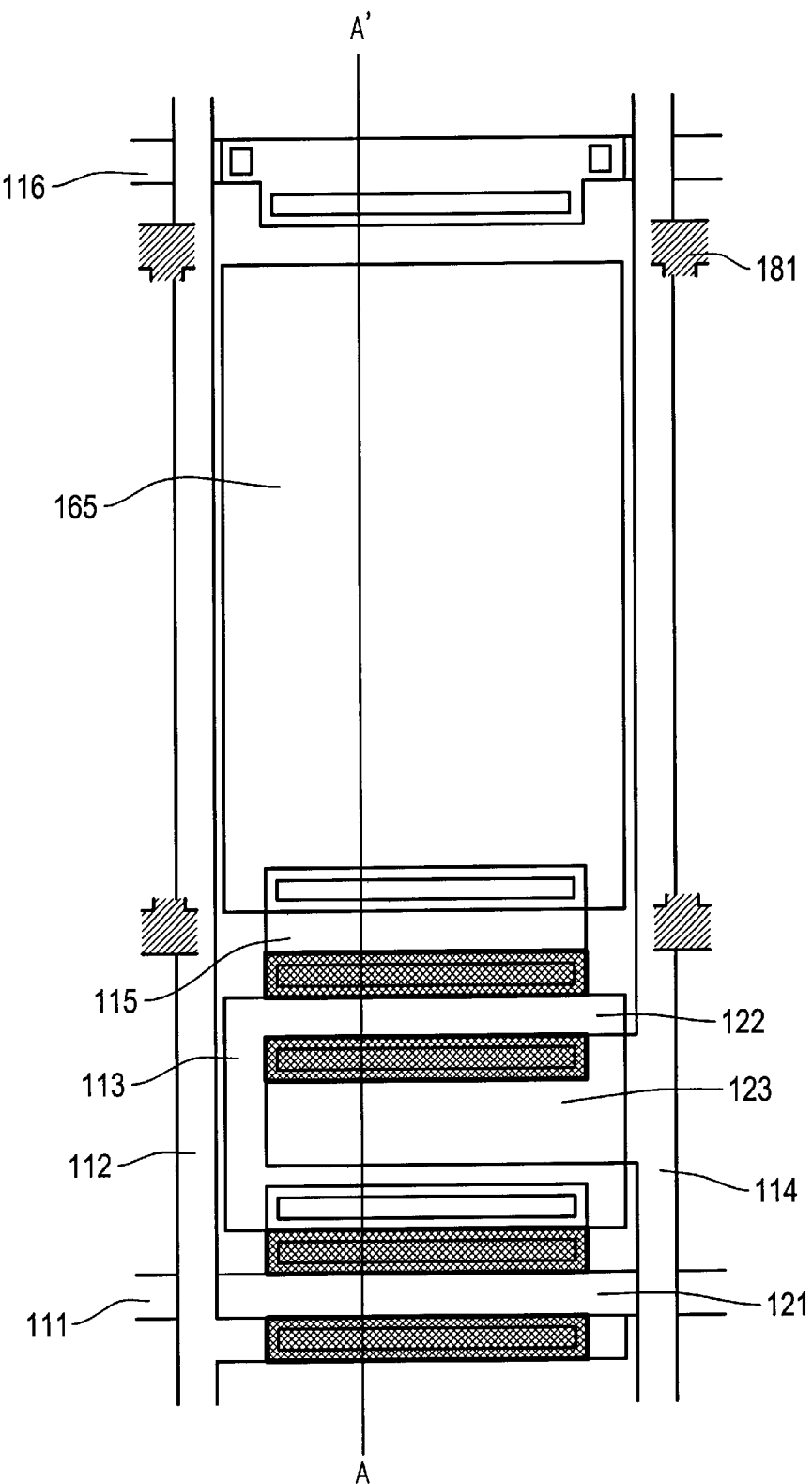
FIG. 20 is a plan view of the organic EL display device having the thin-film transistor of the conventional form.

FIG. 14 is a sectional view of the organic EL display device having a thin-film transistor of the third embodiment. FIG. 15 is a plan view of the organic EL display device having the thin-film transistor of the third embodiment. The sections taken along the lines A–A' and B–B' of FIG. 14 correspond to sections taken along the lines A–A' and B–B' of FIG. 15.

In this embodiment, the first rectifier 142, the second rectifier 143, the third rectifier 144, and the fourth rectifier 145 are formed by a PN junction or a PIN junction, and are formed simultaneously with the switching thin-film transistor 121, or the current thin-film transistor 122. Due to this arrangement, a reduction in deterioration of the current thin-film transistor 122 due to a DC voltage or a direct current can be achieved, and further, an improvement in luminous efficiency and a reduction in power consumption can be achieved by causing the organic EL device 134 to emit light during the periods of both the odd-number frame 201 and the even-number frame 202 without involving an additional producing process.

Although in this embodiment described above, two transistors, i.e. a switching thin-film transistor and a current thin-film transistor are provided in each pixel, it is to be understood that a construction in which each pixel has one transistor provides the same effect. Further, although in the above embodiment a frame inversion system is employed, the same effect will be obtained by employing it together with a voltage sign inverting system of the first feeder with respect to the second feeder for each scanning line, each data line, or each pixel.

As described above, a construction employing a thin-film transistor as a switching element is adopted in this embodiment. The deterioration of a thin-film transistor over time due to a direct current or a DC voltage is considerable. However, a significant reduction in deterioration over time can be realized by using the construction of this invention. The construction in accordance with this invention can improve the luminous efficiency of the luminescent element other than an organic EL device that can emit light when a current flows in only one direction by rectification.

INDUSTRIAL APPLICABILITY

The display apparatus in accordance with this invention can be used as a display device comprising a current driving type luminescent element such as an organic EL device or an inorganic EL device, and a switching element for driving the luminescent element such as TFT.

What is claimed is:

1. A display apparatus, comprising:
    a plurality of scanning lines;
    a plurality of data lines;
    a plurality of first feeders; and
    a plurality of second feeders,
    a plurality of pixels, one pixel of the plurality of pixels further comprising:
        a luminescent element; and
        a transistor, one of a source and drain of the transistor being electrically connected to one of the plurality of first feeders, and the other one of the source and drain of the transistor being electrically connected to pixel electrodes,
        the luminescence element being disposed between the transistor and one of the plurality of second feeders, an AC voltage being applied to the plurality of first and second feeders causing a direct current to flow through the luminescent element.

2. A display apparatus according to claim 1, further comprising:
    at least one circuit for applying an AC voltage to the source or drain of said transistor to cause a direct current to flow through said luminescent element.

3. The display apparatus according to claim 1, further comprising:
    the luminescent element comprising a first luminescent element component that emits a light by a current flowing from one of said pixel electrodes to said second feeder and a second luminescent element component that emits a light by a current flowing from said second feeder to another one of said pixel electrodes, the first luminescent element component and the second luminescent element component being electrically arranged in parallel.

4. The display apparatus according to claim 3, further comprising a method for driving said display apparatus, wherein a voltage between said first feeder and said second feeder is inverted at predetermined intervals.

5. The display apparatus according to claim 1, further comprising:

the one pixel further comprising a rectifier electrically arranged in parallel with the luminescent element.

6. The display apparatus according to claim 5, further comprising a method for driving the display apparatus, wherein a voltage between said first feeder and said second feeder is inverted at predetermined intervals.

7. The display apparatus according to claim 5, further comprising:

said luminescent element emitting a light by a current through the luminescent element flowing from one of the pixel electrodes to said one of the second feeders when the rectifier is formed such that a current flowing through the rectifier flows from the one of said second feeders to another one of the pixel electrodes, and the luminescent element emitting a light by a current flowing through the luminescent element flowing from the one of the second feeders to the one of the pixel electrodes when the rectifier is formed such that a current flowing through the rectifier flows from another one of the pixel electrodes to the one of the second feeders.

8. The display apparatus according to claim 7, further comprising a method for driving the current driving type emissive display apparatus, wherein a voltage between said first feeder and said second feeder is inverted at predetermined intervals.

9. A display apparatus, comprising:

a plurality of scanning lines;

a plurality of data lines;

a plurality of first feeders; and a plurality of second feeders, a plurality of pixels, one pixel of the plurality of pixels further comprising:

a luminescent element; and a transistor, one of a source and drain of the transistor being electrically connected to one of the plurality of first feeders, and the other one of the source and drain being electrically connected to pixel electrodes, an AC voltage being applied to the plurality of first and second feeders that causes an alternating current to flow through the transistor, and a direct current to flow through the luminescent element.

10. A display apparatus according to claim 9, further comprising:

at least one circuit for controlling an alternating current flowing through said transistor, and for controlling a direct current flowing through said luminescent element.

11. The display apparatus according to claim 9, further comprising:

the luminescent element comprising a first luminescent element component that emits a light by a current flowing from one of said pixel electrodes to said second feeder and a second luminescent element component that emits a light by a current flowing from said second feeder to another one of said pixel electrodes, the first luminescent element component and the second luminescent element component being electrically arranged in parallel.

12. The display apparatus according to claim 9, further comprising:

the one pixel further comprising a rectifier electrically arranged in parallel with the luminescent element.

13. A display apparatus, comprising:

a plurality of scanning lines;

a plurality of data lines, said scanning lines and said data lines intersecting at a plurality of intersections;

a first feeder; and a second feeder, said display apparatus further having, in correspondence with each intersection of said scanning lines and said data lines:
a first switching element;
a second switching element;
a storage capacitor;
a pixel electrode and
a current driven luminescent element, said first switching element controlling conduction between said data lines and said storage capacitor using a potential of said scanning lines, and said second switching element controlling conduction between said first feeder and said pixel electrode using a potential of said storage capacitor, to thereby emit light by a current flowing through said current driven luminescent element, which is arranged between a first electrode connected to said pixel electrode and a second electrode connected to said second feeder, said display apparatus further comprising:
a first rectifier that causes a current to flow from said pixel electrode to said first electrode;
a second rectifier that causes a current to flow from said second electrode to said pixel electrode;
a third rectifier that causes a current to flow from said second feeder to said first electrode; and
a fourth rectifier that causes a current to flow from said second electrode to said second feeder,
wherein an AC voltage is applied to the first and second feeders to cause said current driven luminescent element to emit light by a direct current flowing from said first electrode through said current driven luminescent element to said second electrode.

14. The display apparatus according to claim 13, at least one of said first rectifier, said second rectifier, said third rectifier, and said fourth rectifier comprising a switching element for rectification, having a gate terminal connected to a source, or a drain terminal, and said switching element for rectification being formed simultaneously with at least one of said first switching element and said second switching element.

15. The display apparatus according to claim 13, at least one of said first rectifier, said second rectifier, said third rectifier, and said fourth rectifier being formed by a PN junction or a PIN junction, and formed simultaneously with at least one of said first switching element and said second switching element.

* * * * *